(12) United States Patent  (10) Patent No.: US 7,558,071 B2
Sugahara  (45) Date of Patent: Jul. 7, 2009

(54) SUBSTRATE MOUNTED WITH ELECTRONIC ELEMENT THEREON

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 12/029,131

(22) Filed: Feb. 11, 2008

(65) Prior Publication Data

US 2008/0144282 A1  Jun. 19, 2008

Related U.S. Application Data

(62) Division of application No. 11/188,005, filed on Jul. 25, 2005, now Pat. No. 7,352,591.

(30) Foreign Application Priority Data

Jul. 28, 2004 (JP) ............................ 2004-220202

(51) Int. Cl.
    *H05K 7/00* (2006.01)
(52) U.S. Cl. .................................... 361/760
(58) Field of Classification Search ............... 361/760, 361/698–699; 257/714; 174/15.1, 252
    See application file for complete search history.

(56) References Cited

U.S. PATENT DOCUMENTS

| | | | |
|---|---|---|---|
| 5,002,123 A | 3/1991 | Nelson et al. | |
| 5,316,077 A | 5/1994 | Reichard | |
| 5,901,037 A | 5/1999 | Hamilton et al. | |
| 5,992,963 A | 11/1999 | Miyake et al. | |
| 6,074,035 A | 6/2000 | Irizawa et al. | |
| 6,386,672 B1 | 5/2002 | Kimura et al. | |
| 7,352,591 B2 * | 4/2008 | Sugahara | 361/760 |

| | | | |
|---|---|---|---|
| 2002/0039280 A1 | 4/2002 | O'Connor et al. | |

FOREIGN PATENT DOCUMENTS

| | | | |
|---|---|---|---|
| EP | 0603860 A2 | 6/1994 | |
| EP | 1122780 A2 | 8/2001 | |

(Continued)

OTHER PUBLICATIONS

EP Search Report dtd Oct. 13, 2006, EP Appln. 05016228.8.

(Continued)

*Primary Examiner*—Jean F Duverne
(74) *Attorney, Agent, or Firm*—Banner & Witcoff, Ltd.

(57) ABSTRACT

A substrate mounted with an electronic element thereon, comprises a base, an insulator, a fluid passage, and a pressurizer. The base is made of a metal. The insulator is made of a ceramic material and provided on one face of the base. The insulator has a heat-generating electronic element mounted on its side facing contrary to the one face. The fluid passage is formed within the base to have liquid flow therethrough, and radiates heat which has been transmitted from the electronic element via the insulator to the base. The pressurizer applies pressure to the liquid within the fluid passage. The pressurizer includes a pressurizing chamber and an actuator unit. The pressurizing chamber is formed within the fluid passage. The actuator unit changes a volume of the pressurizing chamber by displacing a portion of the insulator corresponding to the pressurizing chamber with respect to a direction perpendicular to the one face.

19 Claims, 17 Drawing Sheets

FOREIGN PATENT DOCUMENTS

| | | |
|---|---|---|
| EP | 1249869 A2 | 10/2002 |
| FR | 2689315 A1 | 10/1993 |
| JP | 07-304168 A | 11/1995 |
| JP | 8-072249 A | 3/1996 |
| JP | 8-267732 A | 10/1996 |
| JP | 2000-087862 A | 3/2000 |
| JP | 2001-253075 A | 9/2001 |
| JP | 2002-254643 A | 9/2002 |
| JP | 2003-076445 A | 3/2003 |
| WO | 98/03997 A1 | 1/1998 |
| WO | 98/04109 A1 | 1/1998 |

OTHER PUBLICATIONS

EP Search Report dtd Mar. 9, 2007, EP Appln. 05016228.8.
EP Office Action dtd Nov. 4, 2008, EP Appln. 05 016 228.8.

* cited by examiner

SUBSTRATE MOUNTED WITH ELECTRONIC ELEMENT THEREON

CROSS REFERENCE TO RELATED APPLICATIONS

This application is a divisional of prior U.S. application Ser. No. 11/188,005, filed Jul. 25, 2005, which claims priority to Japanese application no. 2004-220202, filed Jul. 28, 2004, the entire contents of which are incorporated herein by reference.

BACKGROUND OF THE INVENTION

1. Field of the Invention

The present invention relates to a substrate mounted thereon with a heat-generating electronic element such as an IC.

2. Description of Related Art

An electronic device such as a portable phone, a personal computer, or the like includes many electronic elements such as an integrated circuit (IC), a resistance, a capacitor, etc. which are mounted on a substrate. When a heat-generating electronic element such as an IC is mounted, heat generated by the electronic element must surely be radiated to the outside in order to prevent damage to the electronic element itself and damage to other elements therearound. However, for the purpose of downsizing an electronic device, there is a growing tendency for many electronic elements to be disposed close to each other in a small region on the substrate. This makes it difficult to radiate heat generated by the electronic elements to the outside. Therefore proposed are various electronic devices capable of efficient radiation of heat generated by an electronic element.

For example, Japanese Patent Unexamined Publication No. 2003-76445 discloses an electronic device including a heat conductor, cooling fan, and a heat exchanger. The heat conductor is made of a metallic plate, etc. which is in contact with a surface of a heat-generating electronic element such as a CPU. The cooling fan is disposed near the heat conductor. The heat exchanger transmits to a heat medium heat which has come to the heat conductor. Heat is transmitted from the electronic element to the heat conductor, and then the heat exchanger transmits the heat to the heat medium via which the heat is radiated to the outside.

SUMMARY OF THE INVENTION

In the electronic device disclosed in the aforementioned reference, however, heat radiation is encouraged from the surface of the electronic element opposite to a side thereof, i.e., opposite to a side contacting with the substrate, while heat radiation cannot be encouraged from the side of the electronic element contacting with the substrate. In addition, a substrate having a low thermal conductivity such as a so-called glass-epoxy substrate, which is made of a glass cloth whose surface is impregnated with an epoxy resin, is in wide use as the substrate. Therefore, the heat transmitted from the electronic element to the substrate cannot be sufficiently radiated. This can cause a problem of excessive rise of temperature of the electronic element.

An object of the present invention is to provide a substrate mounted thereon with an electronic element, which is capable of efficient radiation of heat generated by the electronic element.

According to a first aspect of the present invention, there is provided a substrate mounted with an electronic element thereon, comprising a base, an insulator, a fluid passage, and a pressurizer. The base is made of a metal. The insulator is made of a ceramic material and provided on one face of the base. The insulator has a heat-generating electronic element mounted on its side facing contrary to the one face. The fluid passage is formed within the base to have liquid flow therethrough, and radiates heat which has been transmitted from the electronic element via the insulator to the base. The pressurizer applies pressure to the liquid within the fluid passage. The pressurizer includes a pressurizing chamber and an actuator unit. The pressurizing chamber is formed within the fluid passage. The actuator unit changes a volume of the pressurizing chamber by displacing a portion of the insulator corresponding to the pressurizing chamber with respect to a direction perpendicular to the one face.

In the foregoing substrate mounted with an electronic element thereon, the metal base has a high thermal conductivity, and the ceramic insulator provided on the base also has a high thermal conductivity. The heat-generating electronic element is mounted on a side of the insulator opposite to a side thereof facing the base. Heat generated by the electronic element is transmitted via the insulator to the base, and further transmitted to liquid within the fluid passage. The liquid which has received the heat is pressurized by the pressurizer to thereby flow within the fluid passage, while transporting the heat away from the electronic element and at the same time radiating the heat via the base to the outside. Like this, the pressurizer pressurizes liquid within the fluid passage to forcibly make the liquid flow. Thereby, the heat generated by the electronic element and transmitted to the liquid can be quickly transported away from the electronic element. Therefore, the heat generated by the electronic element can efficiently be radiated.

According to a second aspect of the present invention, there is provided a substrate mounted with an electronic element thereon, comprising a base, an insulator, and a radiator. The base is made of a metal. The insulator is made of a ceramic material and provided on one face of the base. The insulator has a heat-generating electronic element mounted on its side facing contrary to the one face. The radiator radiates heat which has been transmitted from the electronic element via the insulator to the base. The radiator includes a fluid passage and a member having a plurality of protrusions. The fluid passage is formed within the base to have liquid flow therethrough. The member having a plurality of protrusions is disposed on the side of the insulator on which the electronic element is mounted, at a portion corresponding to the fluid passage with respect to a direction perpendicular to the one face.

In the foregoing substrate mounted with an electronic element thereon, the base is made of a metal which has a high thermal conductivity, and the insulator provided on the base is made of a ceramic material which also has a high thermal conductivity. The heat-generating electronic element is provided on the face of the insulator facing contrary to the base. Heat generated by the electronic element is transmitted via the insulator to the base, and further transmitted to liquid within the fluid passage. The heat received by the liquid within the fluid passage is radiated to the outside by the member having the plurality of protrusions. The plurality of protrusions enlarge a surface area of the member, and therefore increases radiation capability of the member. Like this, the heat generated by the electronic element can efficiently be radiated by means of both of the fluid passage in which liquid flows and the radiator which includes a plurality of protrusions.

BRIEF DESCRIPTION OF THE DRAWINGS

Other and further objects, features and advantages of the invention will appear more fully from the following description taken in connection with the accompanying drawings in which.

DESCRIPTION OF THE PREFERRED EMBODIMENTS

In the following, certain preferred embodiments of the present invention will be described with reference to the accompanying drawings.

Figure 1:
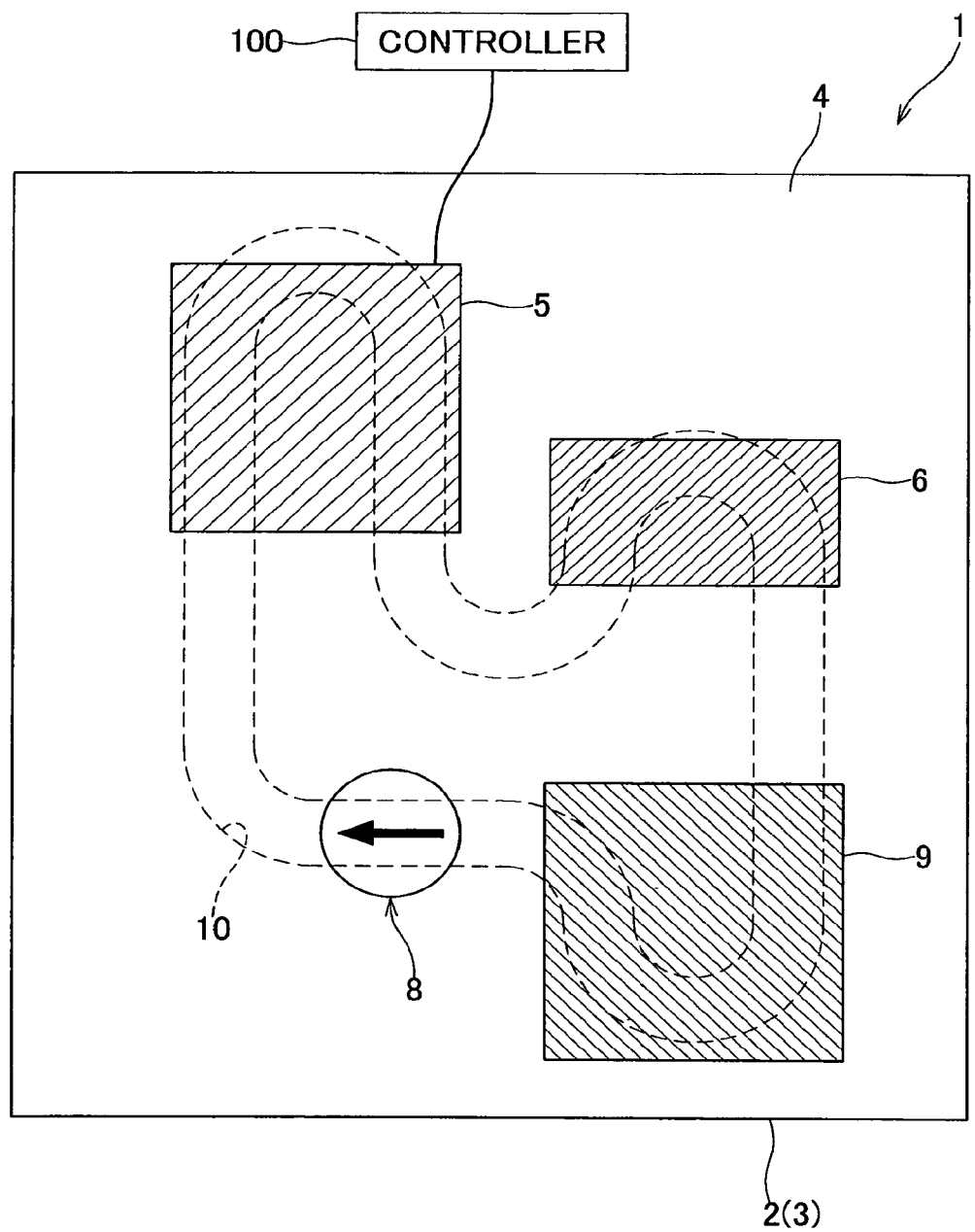
FIG. 1 schematically illustrates a top view of a substrate mounted thereon with electronic elements according to an embodiment of the present invention.
Figure 2:
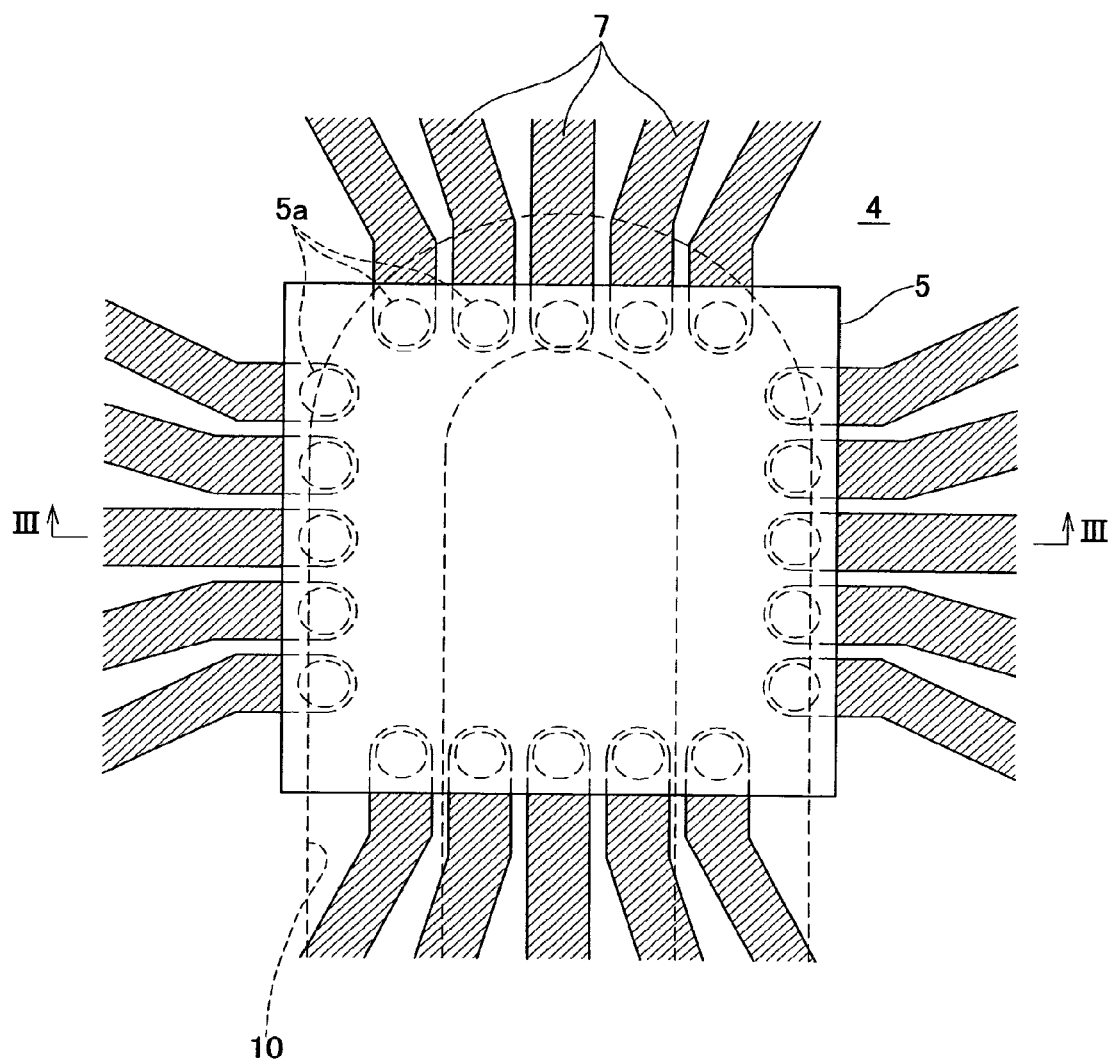
FIG. 2 is an enlarged view around an IC illustrated in FIG. 1.
Figure 3:
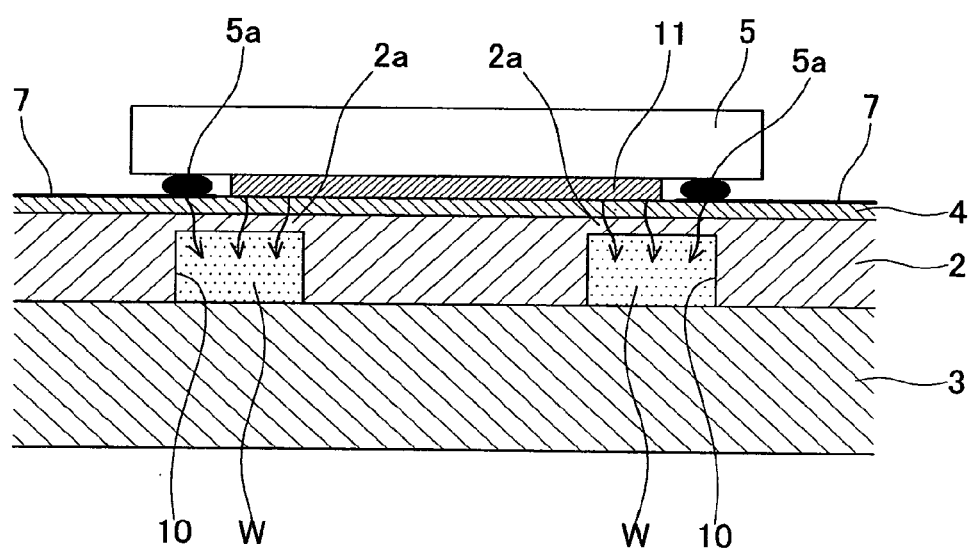
FIG. 3 is a sectional view taken along a line III-III of FIG. 2.

A first embodiment of the present invention will be described. The first embodiment applies the present invention to, as an example, a substrate mounted thereon with an electronic element which is used for an electronic device such as a portable phone, a personal computer, or the like. With respect to a direction perpendicular to the drawing sheet of FIG. 1, a nearer side will hereinafter be defined as an "upper side". As illustrated in FIGS. 1 to 3, a substrate 1 mounted thereon with electronic elements (hereinafter simply referred to as the "substrate 1") according to this embodiment includes two metallic plates 2 and 3, and an insulator 4. The two metallic plates 2 and 3 as a base are put in layers. The insulator 4 is provided on an upper side of the upper plate 2.

The plates 2 and 3 are made of a metallic material having a high thermal conductivity such as stainless steel, iron, copper, nickel, aluminium, etc. The insulator 4 is made of a ceramic material having a high thermal conductivity such as alumina, aluminium nitride, silicon carbide, silicon nitride, mullite, zirconia, etc. A thickness of the insulator 4 can be largely reduced as compared with thicknesses of the metallic plates 2 and 3, by adopting an aerosol-deposition method in which ultra-fine particles of a material are collided against each other at a high speed and deposited. In addition, a sol-gel method, a sputtering method, a CVD (chemical vapor deposition) method, and the like can also be employed in order to form the insulator 4.

ICs 5 and 6 are mounted on an upper side of the insulator 4 with a highly heat-conductive material 11 such as a metallic paste, a metallic film, etc. being interposed therebetween. Also provided on the upper side of the insulator 4 are many wirings 7 which are bonded to terminals (e.g., a terminal 5a) of the electronic elements such as the ICs 5 and 6 so that the electronic elements may be connected to each other. The insulator 4 insulates wirings 7 from each other to ensure that short-circuits cannot occur. Many other electronic elements such as a resistor (not illustrated), a capacitor (not shown), etc. are also provided on the upper side of the insulator 4.7

TABLE 1 shows thermal conductivities of the aforementioned metallic materials which may be adopted as a material of the plates 2 and 3, thermal conductivities of the aforementioned ceramic materials which may be employed as a material of the insulator 4, and a thermal conductivity of the epoxy resin which may be adopted for the glass-epoxy substrate.

As shown in TABLE 1, the thermal conductivities of the metallic materials which may be adopted as the material of the plates 2 and 3 and the thermal conductivities of the aforementioned ceramic materials which may be employed as the material of the insulator 4 are several-ten times to several-hundred times higher than the thermal conductivity of the epoxy resin. Accordingly, as shown by arrows in FIG. 3, most of heat generated by the IC 5 is transmitted through the terminal 5a to the insulator 4 and the plate 2, and then transmitted from the plate 2 away from the IC 5.

In general, a ceramic material is more expensive than a metallic material, and as shown in TABLE 1 a ceramic material often has a thermal conductivity lower than that of a metallic material. In this embodiment, therefore, the thickness of the insulator 4 made of a ceramic material is largely reduced as compared with the metallic plates 2 and 3, in order to realize the substrate 1 which is low in cost and high in radiation efficiency.

As illustrated in FIGS. 1 to 3, a closed-loop passage 10 is formed inside the two plates 2 and 3 so that it may go through regions where the ICs 5 and 6 which generate a large amount of heat are disposed. As illustrated in FIG. 3, the passage 10 is formed by putting the plate 3 on a lower side of the upper plate 2 so as to close a recess which has a rectangular section and opens in a lower side of the plate 2. A thin portion 2a of the upper plate 2 exists between the passage 10 and the insulator 4. The recess may be formed by means of a half-etching process, etc. The passage 10 is filled with water W which receives pressure from a later-described pressurizer 8 to thereby flow within the passage 10.

Further, as illustrated in FIG. 1, a pressurizer 8 and a radiation plate 9 are provided at portions corresponding to a region where the passage 10 is formed. The pressurizer 8 applies pressure onto the water W within the passage 10, thereby forcing the water W to flow.

Figure 4:
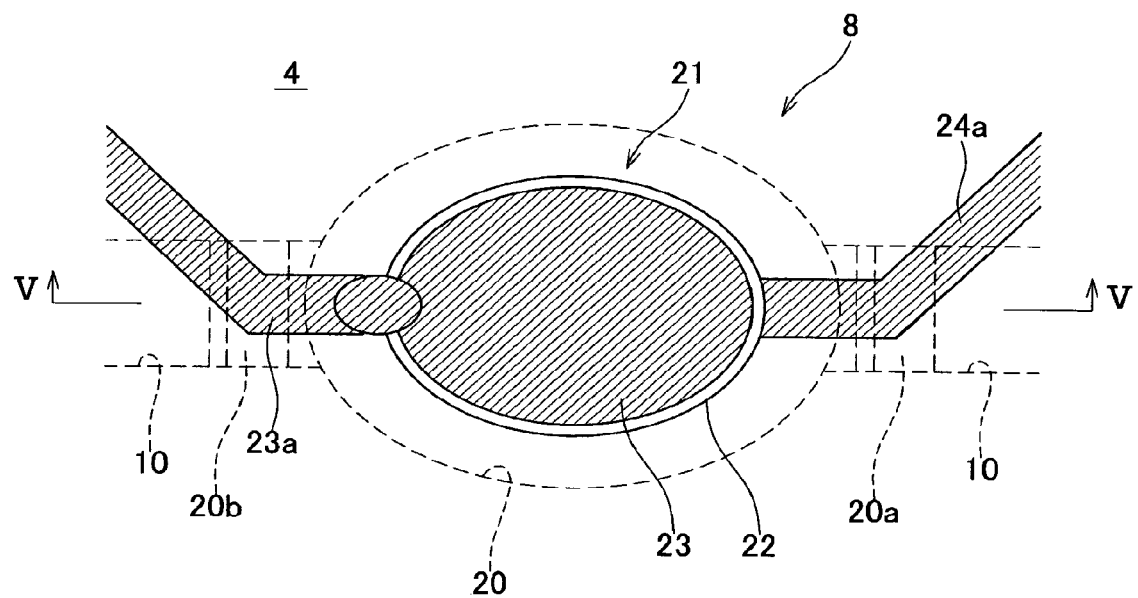
FIG. 4 is an enlarged view around a pressurizer illustrated in FIG. 1.
Figure 5:
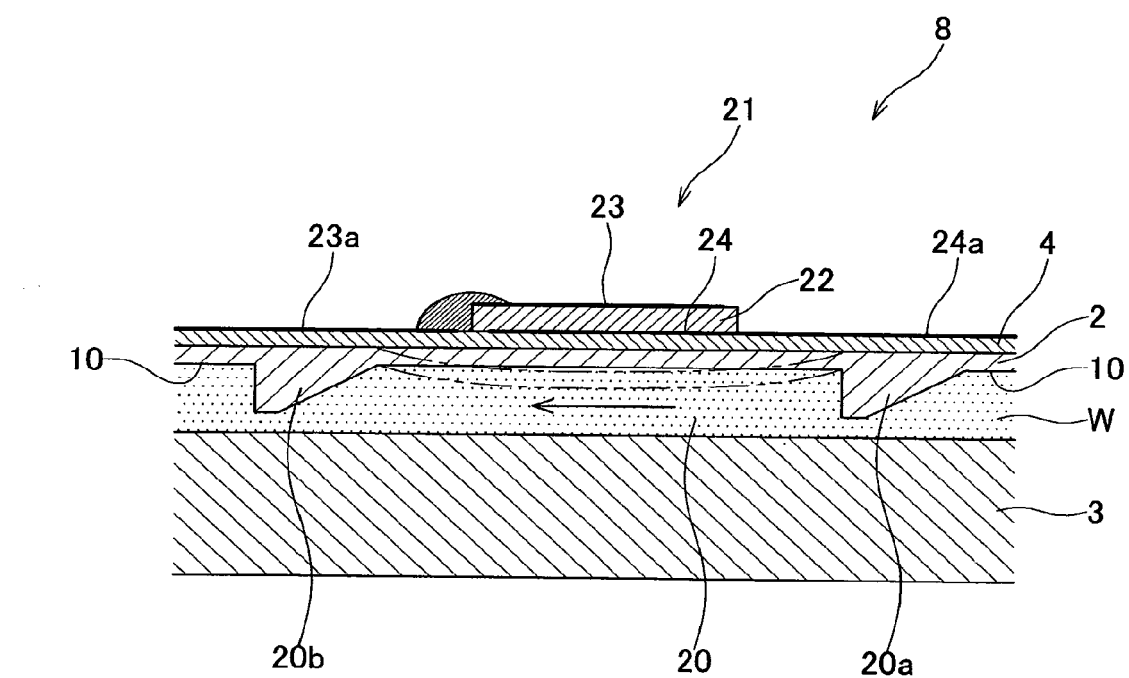
FIG. 5 is a sectional view taken along a line V-V of FIG. 4.

As illustrated in FIGS. 4 and 5, the pressurizer 8 includes a pressurizing chamber 20 and a piezoelectric actuator 21. The pressurizing chamber 20 is formed inside the passage unit 10. The piezoelectric actuator 21 is disposed above the pressurizing chamber 20 and changes the volume of the pressurizing chamber 20. Referring to FIG. 4, a width of the pressurizing chamber 20 is larger than a width of the passage 10. The water W within the passage 10 flows into the pressurizing chamber 20 from a right side of FIGS. 4 and 5, and receives pressure within the pressurizing chamber 20 so that the water W is then sent out to a left side of FIGS. 4 and 5.

A protrusion 20a is formed at a portion where the pressurizing chamber 20 is connected to the passage 10 on an upstream side of the pressurizing chamber 20 with respect to a flow direction of the water W (i.e., on the right side of the pressurizing chamber 20 in FIGS. 4 and 5). A protrusion 20b is formed at a portion where the pressurizing chamber 20 is connected to the passage 10 on a downstream side of the pressurizing chamber 20 with respect to the flow direction of the water W (i.e., on the left side of the pressurizing chamber 20 in FIGS. 4 and 5). As illustrated in FIG. 5, each of the protrusions 20a and 20b protrudes downward, and has a substantially right-triangle shape in a cross-sectional view. That is, each of the protrusions 20a and 20b vertically protrudes at its downstream side in the flow direction of the water W, and slants upward from this protruding portion to its upstream side. In the vicinity of the protrusions 20a and 20b, a flow resistance to the water W flowing from the downstream side to the upstream side is lower than a flow resistance to the water W flowing from the upstream side to the downstream side. The water W is controlled to flow only in the direction from the upstream side to the downstream side.

The flow of the water W may be controlled by means of a valve instead of the protrusions 20a and 20b.

The piezoelectric actuator 21 includes an electrode 24, a piezoelectric layer 22, and an electrode 23. The electrode 24 is formed on the upper side of the insulator 4 at a position corresponding to the pressurizing chamber 20. The piezoelectric layer 22 is formed on a surface of the electrode 24. The electrode 23 is formed on a surface of the piezoelectric layer 22. A base of the piezoelectric layer 22 is a lead zirconate titanate having ferroelectricity. The upper electrode 23 is grounded via a wiring 23a, and the lower electrode 24 is connected to the IC 5 via a wiring 24a. The lower electrode 24 is supplied with a drive pulse signal from the IC 5, so that a predetermined voltage is applied to the lower electrode 24 at regular intervals. When the IC 5 applies the predetermined voltage to the lower electrode 24, the piezoelectric layer 22 sandwiched between the electrodes 23 and 24 incurs an electric field along its thickness direction, and therefore contracts in the horizontal direction which is perpendicular to the polarization direction. When the piezoelectric layer 22 thus contracts, as illustrated with chain lines in FIG. 5, a portion of the plate 2 and a portion of the insulator 4 corresponding to the pressurizing chamber 20 deform into a convex toward the pressurizing chamber 20, to reduce the volume of the pressurizing chamber 20. Thereby, the water W within the pressurizing chamber 20 receives pressure and is sent out to the downstream side.

As illustrated in FIG. 1, the IC 5 is connected to a controller 100. The controller 100 controls the aforementioned drive pulse signal which is supplied from the IC 5 to the electrode 24 of the piezoelectric actuator 21. To be more specific, the controller 100 generates predetermined data and sends the data to the IC 5, and the IC 5 generates the drive pulse signal based on the data received from the controller 100 and sends the signal to the electrode 24 of the piezoelectric actuator 21.

The flow (quantity, speed, etc.) of the water W within the passage 10, which depends on drive of the piezoelectric actuator, is one of factors which determine a radiation capability of the passage 10. In this embodiment, therefore, the controller 100 (see FIG. 1) controls, via the IC 5, the drive of the piezoelectric actuator 21 in the pressurizer 8 such that a radiation capability of the passage 10 together with the radiation plate 9 may exceed both of a radiation capability of the insulator 4 and a radiation capability of the layered structure of the plates 2 and 3. The flow of the water W within the passage 10 is thereby controlled. Since the radiation capability of the passage 10 is controlled in this manner, the passage 10 can efficiently radiate heat generated by the ICs 5 and 6 as will be detailed later.

Figure 6:
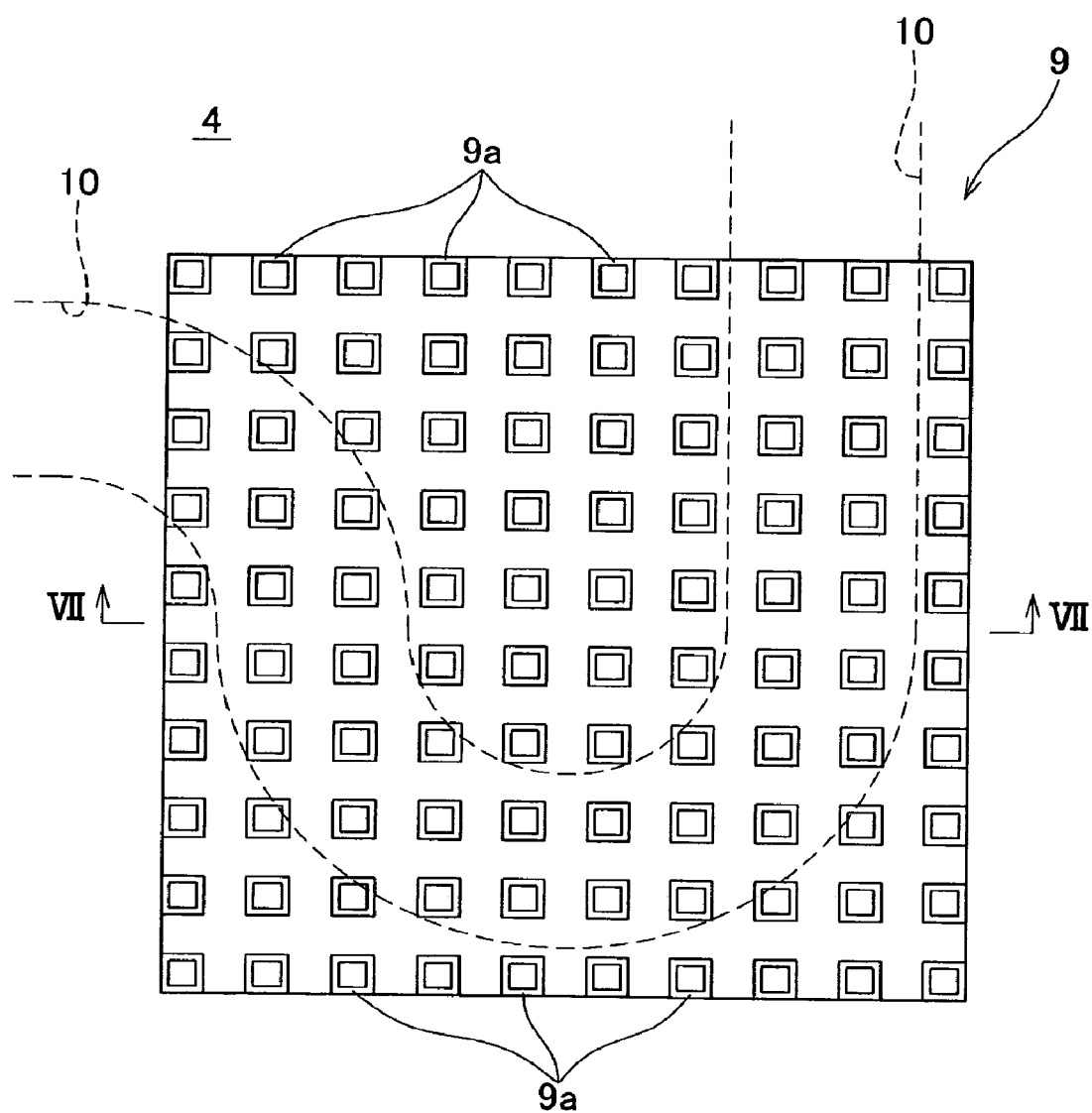
FIG. 6 is an enlarged view around a radiation plate illustrated in FIG. 5.
Figure 7:
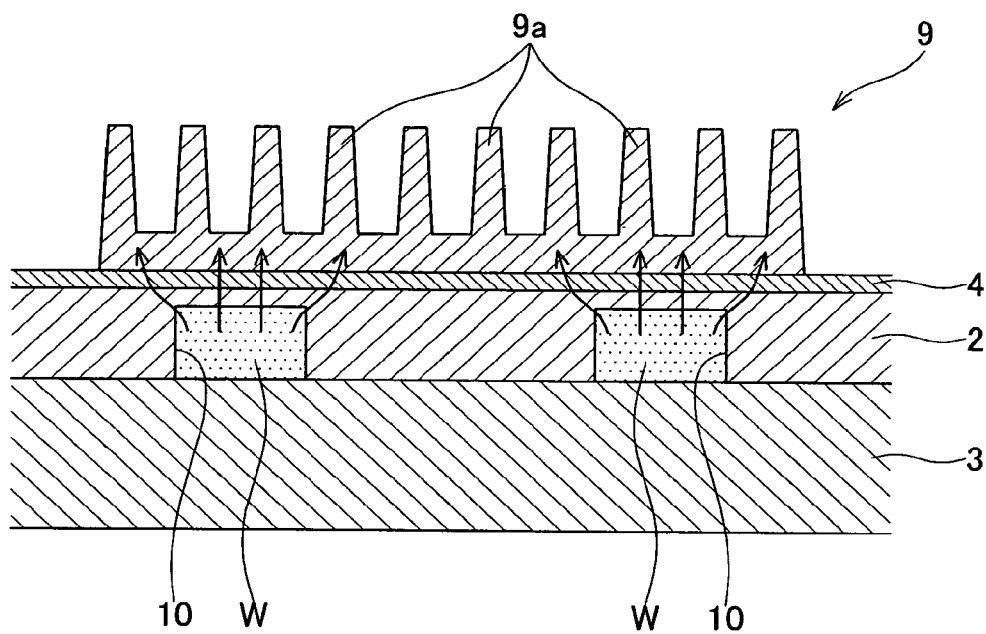
FIG. 7 is a sectional view taken along a line VII-VII of FIG. 6.

Referring to FIG. 1, the radiation plate 9 is disposed on the upper side of the insulator 4 to be away from the ICs 5 and 6. The passage 10 passes under the radiation plate 9. The heat rides on the water W which flows within the passage 10, and is transmitted via the plate 2 and the insulator 4 to the radiation plate 9, as shown by arrows in FIG. 7. As illustrated in FIGS. 6 and 7, the radiation plate 9 has many protrusions 9a protruding upward. These many protrusions 9a enlarge a surface area of the radiation plate 9, and therefore the radiation capability of the radiation plate 9 is increased. Specifically, as described above, a radiation capability of the radiation plate 9 together with the passage 10 exceeds both of a radiation capability of the insulator 4 and a radiation capability of the layered structure of the plates 2 and 3. The heat transmitted to the radiation plate 9 is efficiently radiated from the protrusions 9a.

In the substrate 1 of the first embodiment described above, the plates 2 and 3 as the base are made of a metal having a high thermal conductivity, and the insulator 4 formed on the plate 2 is also made of a ceramic material having a high thermal conductivity. The ICs 5 and 6 which generate heat are mounted on the side of the insulator 4 opposite to the side facing the plate 2. The heat generated by the ICs 5 and 6 is transmitted via the insulator to the plate 2, and further transmitted to the water W within the passage 10. The water W which has received the heat is pressurized by the pressurizer 8 to thereby flow within the passage, while transporting the heat away from the ICs 5 and 6 and at the same time radiating the heat via the plates 2 and 3 to the outside. Moreover, the heat transported by the water W within the passage 10 is radiated through the radiation plate 9 to the outside. In this embodiment, thus, the heat generated by the ICs 5 and 6 can efficiently be radiated by means of both of the passage 10 in which the water W flows and the radiation plate 9 having many protrusions 9a.

As illustrated in FIG. 1, when seen perpendicularly to the drawing sheet (i.e., perpendicularly to planes of the insulator 4 and the plates 2 and 3), the passage 10 goes through areas corresponding to the ICs 5 and 6. Therefore, the heat generated by the ICs 5 and 6 can more quickly be transmitted to the water W within the passage 10. Thus, the heat generated by the ICs 5 and 6 can more efficiently be radiated.

Moreover, since the protrusions 20a and 20b are provided, backflow of the water W within the passage 10 can be prevented, and therefore the water W can transport the heat steadily and smoothly.

Since the pressurizer 8 pressurizes the water W within the passage 10 to force the water W to flow, the heat generated by the ICs 5 and 6 and transmitted to the water W can be quickly transported away from the ICs 5 and 6. Thus, the heat generated by the ICs 5 and 6 can more efficiently be radiated.

The pressurizer 8 of this embodiment is the relatively simple, reliable one including the pressurizing chamber 20 and the piezoelectric actuator 21. Specifically, the piezoelectric layer 22 is deformed by controlling potentials of respective electrodes 23 and 24 of the piezoelectric actuator 21. Thereby, the volume of the pressurizing chamber 20 is changed, and pressure can surely be applied to the water W within the pressurizing chamber 20.

Since the position of the radiation plate 9 corresponds to the passage 10 with respect the direction perpendicular to the drawing sheet of FIG. 1, the heat carried on the water W within the passage 10 is radiated to the outside via the many protrusions 9a of the radiation plate 9 as shown by the arrows in FIG. 7. Therefore, a temperature of the water W within the passage 10 can quickly be decreased. Thus, the heat generated by the ICs 5 and 6 can more efficiently be radiated.

As illustrated in FIG. 3, the highly heat-conductive material 11 such as a metallic paste and a metallic film is interposed between the ICs 5 and the insulator 4. Accordingly, a contact area between the ICs 5 and the insulator 4 is increased, so that heat of the IC 5 can more easily be transmitted to the insulator 4.

Since the passage 10 is a closed loop, a system for supplying the water W from the outside into the passage 10 and discharging the water W from the passage 10 to the outside is not required and thus the structure of the substrate 1 can be simplified.

As illustrated in FIG. 3, the thin portion 2a of the plate 2 made of a metallic material which is relatively strong is interposed between the passage 10 and the insulator 4 made of a ceramic material which generally is less strong than a metallic material. This can suppress deterioration in strength of the substrate 1 at portions where the passage 10 is formed.

Next, a description will be given to various modifications of the above-described first embodiment. Here, the same members as those of the first embodiment will be denoted by the common reference numerals without their specific descriptions.

Figure 8:
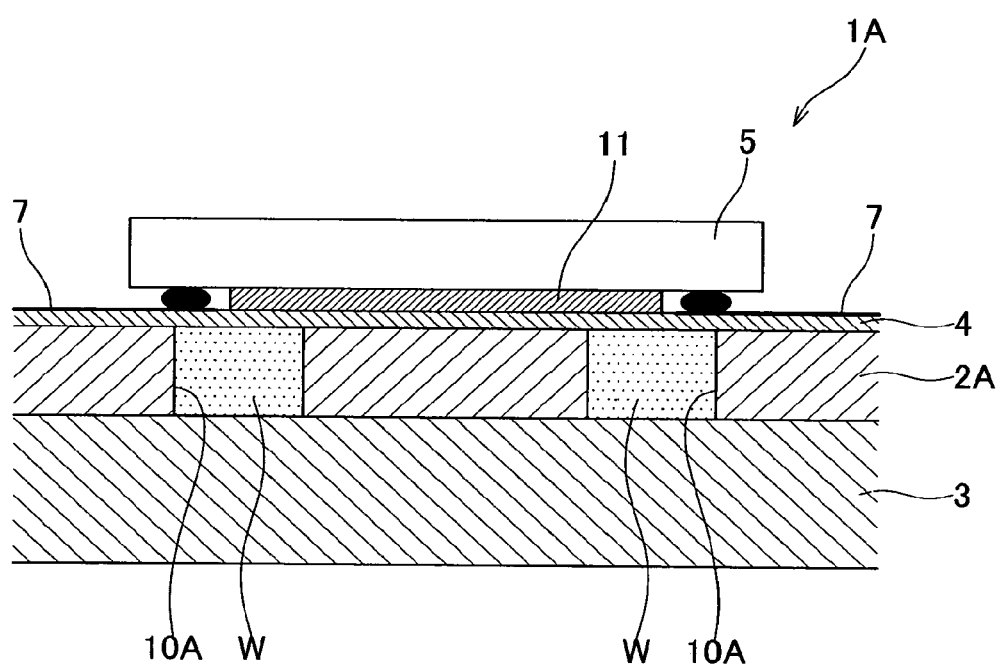
FIG. 8 is a sectional view according to a first modification of the first embodiment, which corresponds to FIG. 3.

FIG. 8 illustrates a substrate 1A according to a first modification of the first embodiment. In the first embodiment the passage 10 is formed by the recess which opens in the lower side of the upper plate 2, whereas in this modification a passage 10A is formed by a through hole which extends through an upper plate 2A in its thickness direction. This through hole may be formed by a full-etching process, etc. Water W within the passage 10A is in contact with a lower side of an insulator 4 at a portion corresponding to an IC 5. Therefore, heat coming from the IC 5 to the insulator 4 can more quickly be transmitted to the water W, so that efficient radiation of heat can be realized.

Figure 9:
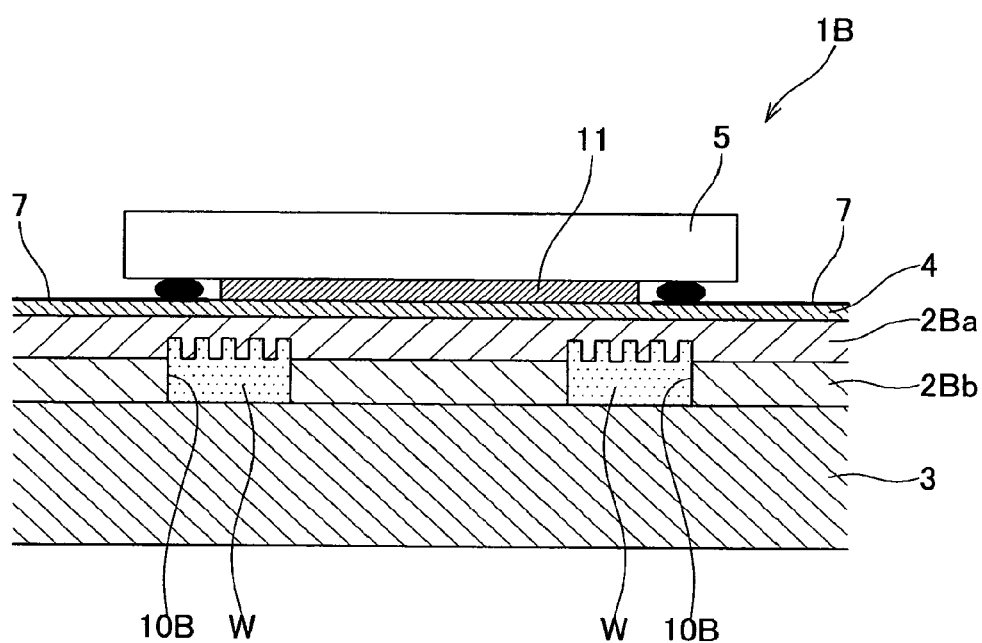
FIG. 9 is a sectional view according to a second modification of the first embodiment, which corresponds to FIG. 3.

FIG. 9 illustrates a substrate 1B according to a second modification of the first embodiment. In the first embodiment the number of metallic plates as the base is two, whereas in this modification the number of metallic plates is three. A passage 10B is formed in upper two plates 2Ba and 2Bb. An upper side of the passage 10B is uneven. When a face defining the passage 10B is partially uneven, this unevenness increases a contact area between the plate and water W, and therefore heat transmission efficiency can be improved. Consequently, heat which has come from an IC 5 via an insulator 4 to a plate 2Ba can more efficiently be transmitted to the water W. Thus, the heat generated by the IC 5 can more efficiently be radiated.

In the example of FIG. 9, the passage 10B which is uneven at its upper side can be provided easily by forming a hole through a thickness of the middle plate 2Bb using a full-etching process, etc. and at the same time forming many recesses in a lower side of the uppermost plate 2Ba at a portion opposed to the through hole using a half-etching process, etc.

The unevenness can be provided at an arbitrary portion of a face which defines the passage 10. A side face or a lower face of the passage 10 may be uneven. In the second modification, in particular, the unevenness is provided in the upper face which is nearest to the IC 5 among faces defining the passage 10B. Therefore, heat generated by the IC 5 can be transmitted to the water W quickly and efficiently.

Figure 10:
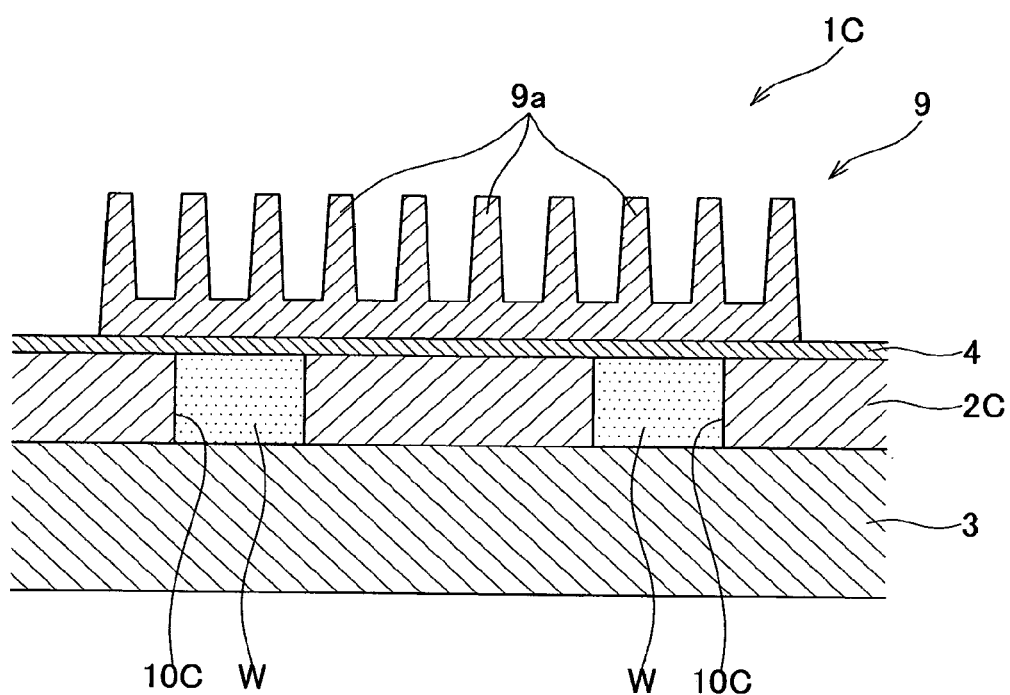
FIG. 10 is a sectional view according to a third modification of the first embodiment, which corresponds to FIG. 7.

FIG. 10 illustrates a substrate IC according to a third modification of the first embodiment. In this modification, in a region where a radiation plate 9 is disposed, a passage 10C is formed by a through hole extending through an upper plate 2C in its thickness direction, which is the same as in the first embodiment. Water W within the passage 10C is in contact with a lower side of an insulator 4 at a portion corresponding to the radiation plate 9. Therefore, heat transported by the water W flowing within the passage 10C can easily be transmitted to the radiation plate 9. Thus, heat can more smoothly be radiated to the outside from many protrusions 9a of the radiation plate 9.

Figure 11:
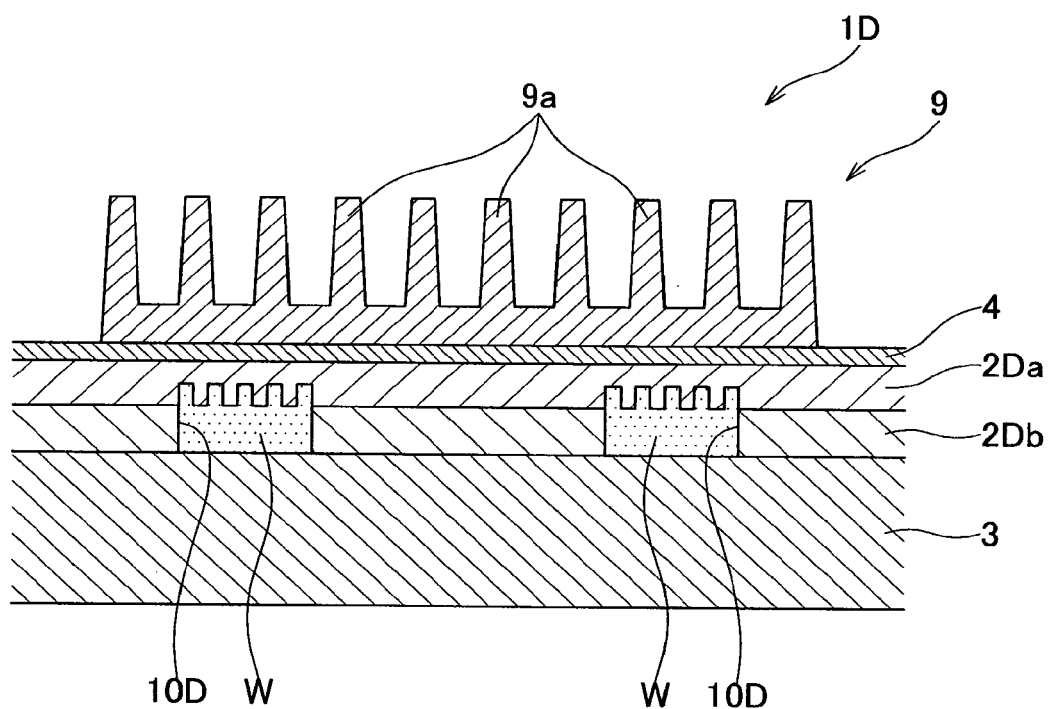
FIG. 11 is a sectional view according to a fourth modification of the first embodiment, which corresponds to FIG. 7.

FIG. 11 illustrates a substrate ID according to a fourth modification of the first embodiment. In this modification, in a region where a radiation plate 9 is disposed, a passage 10D is formed in, among three metallic plates 2Da, 2Db, and 3, upper two plates 2Da and 2Db and an unevenness is provided at an upper side of the passage 10D, i.e., at a portion nearer to the radiation plate 9, which is the same as in the above-described second modification. In this case, heat transmitted from the radiation plate 9 via an insulator 4 to the plate 2Da can more efficiently be transmitted to water W. The passage 10D can easily be formed in a manner similar to the passage 10B of the second modification.

The pressurizer that applies pressure to the water W within the passage is not limited to the one including the pressurizing chamber 20 and the piezoelectric actuator 21 as in the first embodiment. Various constructions may be employed instead. Moreover, the pressurizer can even be omitted. For example, in a fifth modification of the first embodiment illustrated in FIG. 12, heat generated by the IC 5 can efficiently be radiated even without the pressurizer.

Figure 12:
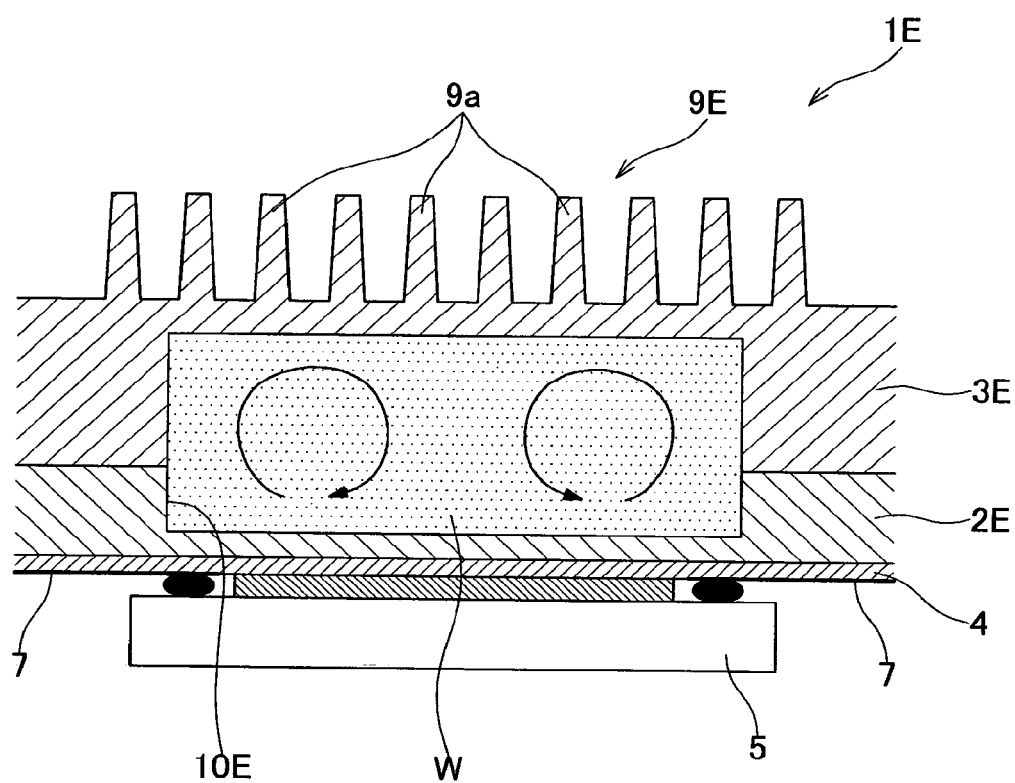
FIG. 12 is a sectional view around an IC and a radiation plate according to a fifth modification of the first embodiment.

A substrate 1E of the fifth modification illustrated in FIG. 12 differs from the substrate of the first embodiment in arrangement of a base, an insulator, an IC, and a radiation plate. More specifically, an insulator 4 is formed on a lower side of a lower plate 2E as a base, and an IC 5 is mounted on a lower side of the insulator 4. A radiation plate 9E having many protrusions 9a protruding upward as in the first embodiment is provided on an upper side of an upper plate 3E at a portion corresponding to the IC 5. That is, in the first embodiment the radiation plate 9 is disposed away from the ICs 5 and 6 as illustrated in FIG. 1, whereas in this modification the radiation plate 9E is disposed at a position corresponding to the IC 5 with respect to a direction perpendicular to planes of the plate 2E and 3E. In this case, heat generated by the IC 5 is transmitted via the insulator 4 to the plates 2E and 3E, and then smoothly transmitted from the plates 2E and 3E to the radiation plate 9E directly and via water W within a passage 10E. Therefore, the heat generated by the IC 5 can efficiently be radiated even without the pressurizer.

In addition, the passage 10 of the first embodiment is formed by the recess which is provided in the upper plates 2 among the two plates 2 and 3, whereas the passage 10E of the fifth modification is formed by recesses which are provided in the respective two plates 2E and 3E and have the same shape in a plan view. To be more specific, in this modification, the passage 10E extending over the two plates 2E and 3E is formed by laminating the plates 2E and 3E with their recesses being aligned. In this case, heat generated by the IC 5 and transmitted via the insulator 4 to the lower plate 2E is then transmitted to the upper plate 3E directly through an interface between the plates 2E and 3E or alternatively via the water W within the passage 10E. At this time, within the recess of the lower plate 2E, a temperature of the water W rises. Consequently, upper water and lower water within the passage 10 show different temperatures. Therefore, natural convection as shown by arrows in FIG. 12 occurs in the passage 10. This convection promotes the aforesaid heat transportation from the lower plate 2E to the upper plate 3E, to improve efficiency of heat transmission to the radiation plate 9E and efficiency of heat radiation to the outside.

Figure 13:
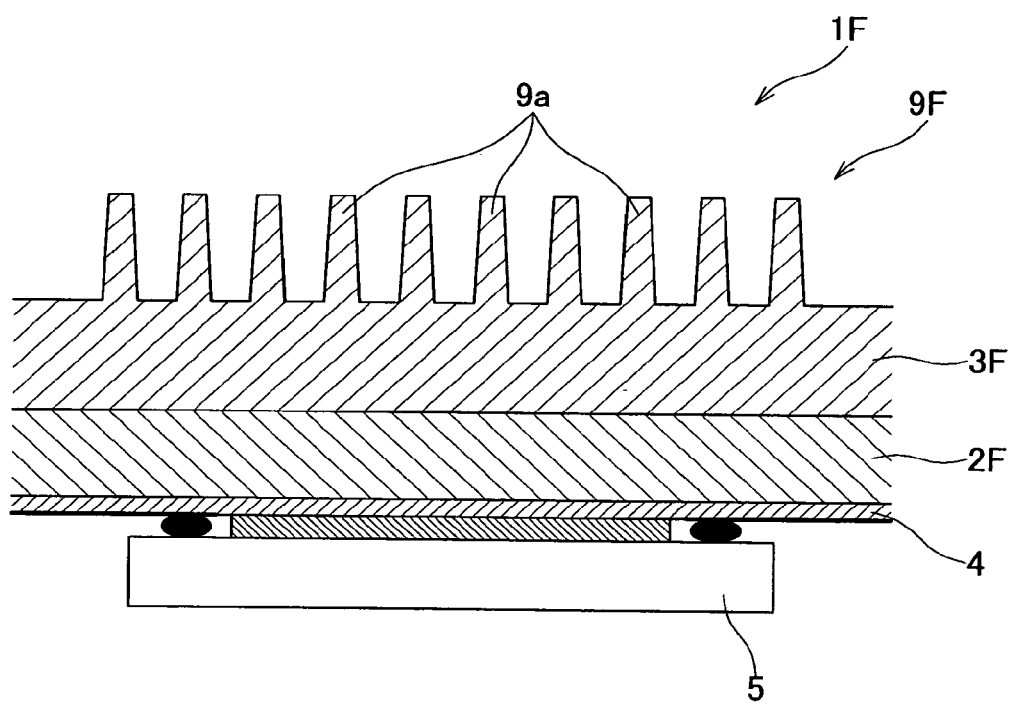
FIG. 13 is a sectional view around an IC and a radiation plate according to a sixth modification of the first embodiment.

FIG. 13 illustrates a substrate 1F according to a sixth modification of the first embodiment. In this modification, the passage 10, 10A to 10E is omitted. This modification differs from the first embodiment in arrangement of a base, an insulator, an IC, and a radiation plate, which is the same as the modification illustrated in FIG. 12. More specifically, an insulator 4 is formed on a lower side of a lower plate 2F as a base, and an IC 5 is mounted on a lower side of the insulator 4. A radiation plate 9F having many protrusions 9a protruding upward as in the first embodiment is provided on an upper side of an upper plate 3F at a portion corresponding to the IC 5. A radiation capability of the radiation plate 9F exceeds both of a radiation capability of the insulator 4 and a radiation capability of a layered structure of the plates 2F and 3F.

When the passage 10, 10A to 10E is provided, the water W within the passage receives heat generated by the ICs 5 and 6, and flows within the passage while transporting the heat away from the ICs 5 and 6 and thus radiating the heat. Therefore, existence of the passage 10, 10A to 10E is effective for radiating heat. However, even without the passage 10, 10A to 10E as in this modification, heat generated by the IC 5 is transmitted to the radiation plate 9F from which the heat can be radiated to the outside. This can be achieved because the radiation capability of the radiation plate 9F exceeds both of the radiation capability of the insulator 4 and the radiation capability of the layered structure of the plates 2F and 3F. In this case, since a recess and a hole for constituting a passage should not be formed in the plates 2F and 3F, a structure of the substrate 1F is simplified and it can easily be manufactured.

Figure 14:
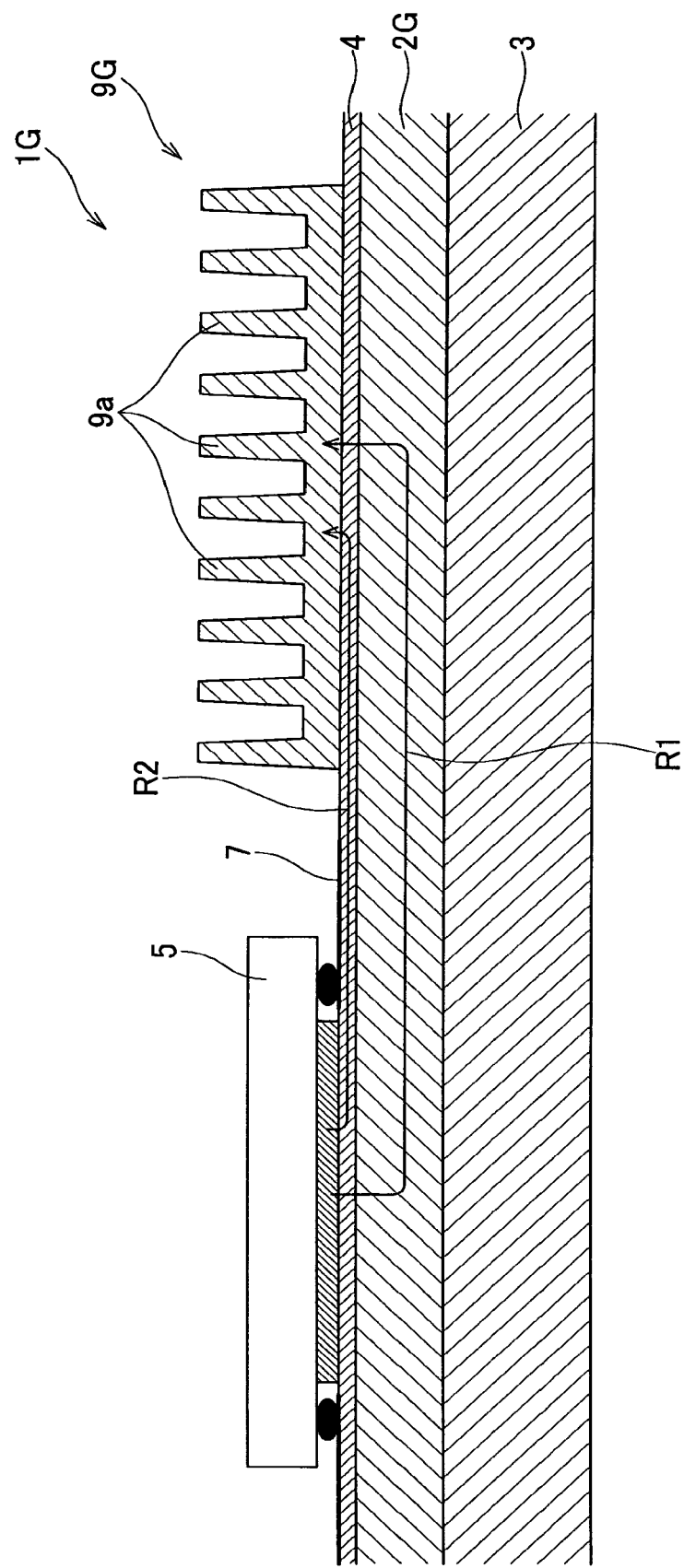
FIG. 14 is a sectional view around an IC and a radiation plate according to a seventh modification of the first embodiment.

FIG. 14 illustrates a substrate 1G according to a seventh modification of the first embodiment. In this modification, similarly to in the sixth modification, the passage 10, 10A to 10E is omitted. At the same time, a radiation plate 9G is disposed on an upper side of an insulator 4 such that the radiation plate 9G can be adjacent to the IC 5. In this case, heat generated by the IC 5 is transmitted to the radiation plate 9G possibly through two paths: a path R1 passing through the insulator 4 and an upper plate 2G; and a path R2 passing through the insulator 4 alone. Since the insulator 4 is very thin as compared with the plate 2G and therefore has a small heat capacity, most of the heat generated by the IC 5 is transmitted to the radiation plate 9G through the path R1. A radiation capability of the radiation plate 9G of this modification exceeds both of a radiation capability of the insulator 4 and a radiation capability of a layered structure of the plates 2G and 3, which is the same as the radiation plate 9F.

In the sixth and seventh modification described above, the passage 10, 10A to 10F is omitted. However, only the passage may be provided without the radiation plate. In this case, as will be detailed later, it is preferable to control a radiation capability of the passage such that it may exceed both of a radiation capability of the insulator 4 and a radiation capability of a layered structure of the plates.

The passage in which the water W flows is not limited to a closed-loop one. For example, it is also possible that opposite ends of a passage is open to the outside so that cooled water W of relatively low temperature is supplied into one end via a tube, etc. and water within the passage which has received heat and increased in temperature is discharged through the other end to the outside. In this case, a pressurizer for applying pressure to water and a radiation plate for radiating heat transmitted to the water may be provided outside the substrate.

In order to improve efficiency for heat radiation, the passage is preferably disposed at a position corresponding to the IC or the radiation plate with respect to the direction perpendicular to the plane of the plate as a base, as in the first embodiment and its first to fifth modifications. However, this is not limiting.

Factors which determine a radiation capability of the passage 10, 10A to 10E include physical properties (e.g., heat capacity) of liquid in addition to the aforementioned flow (quantity, speed, etc.) of liquid flowing within the passage. Thus, the radiation capability of the passage may be controlled by means of any appropriate approaches. As one of the approaches, a kind of liquid may be changed. Alternatively, the flow of the water W within the passage 10 may be controlled using the controller 100 (see FIG. 1) as in the first embodiment, for controlling the drive of the piezoelectric actuator 21 of the pressurizer 8 such that the radiation capability of the passage (plus radiation capability of other radiators, if any such as the radiation plate 9, 9E to 9G) may exceed both of the radiation capability of the insulator and the radiation capability of the plate.

It is preferable to set the radiation capability of the passage at not less than a predetermined value by controlling flow of liquid within the passage 10, 10A to 10E by means of the controller 100, the pressurizer 8, or the like. However, this is not limiting. For example, when liquid within the passage has an excellent radiation capability, a means for controlling a radiation capability of the passage (e.g., the controller 100, the pressurizer 8, or the like) may be omitted.

Figure 15:
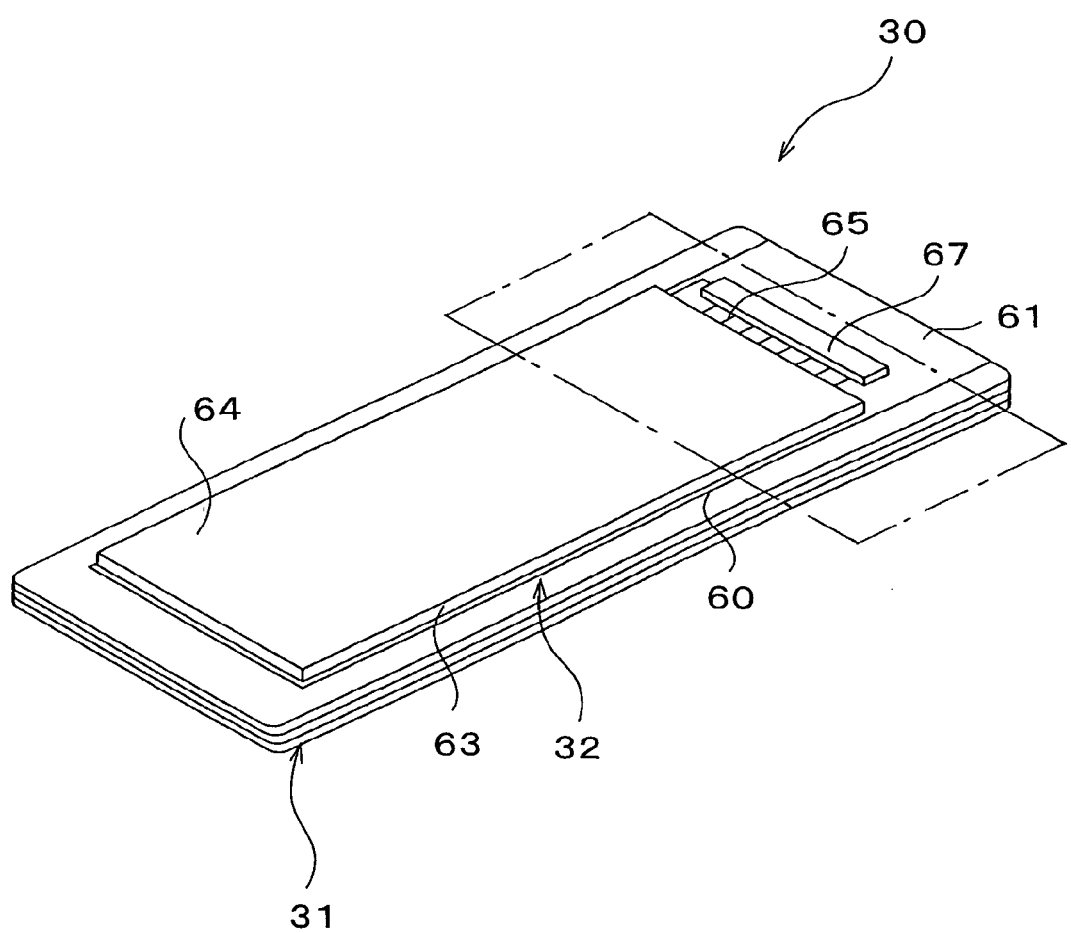
FIG. 15 is a perspective view of an ink-jet head according to a second embodiment of the present invention.
Figure 16:
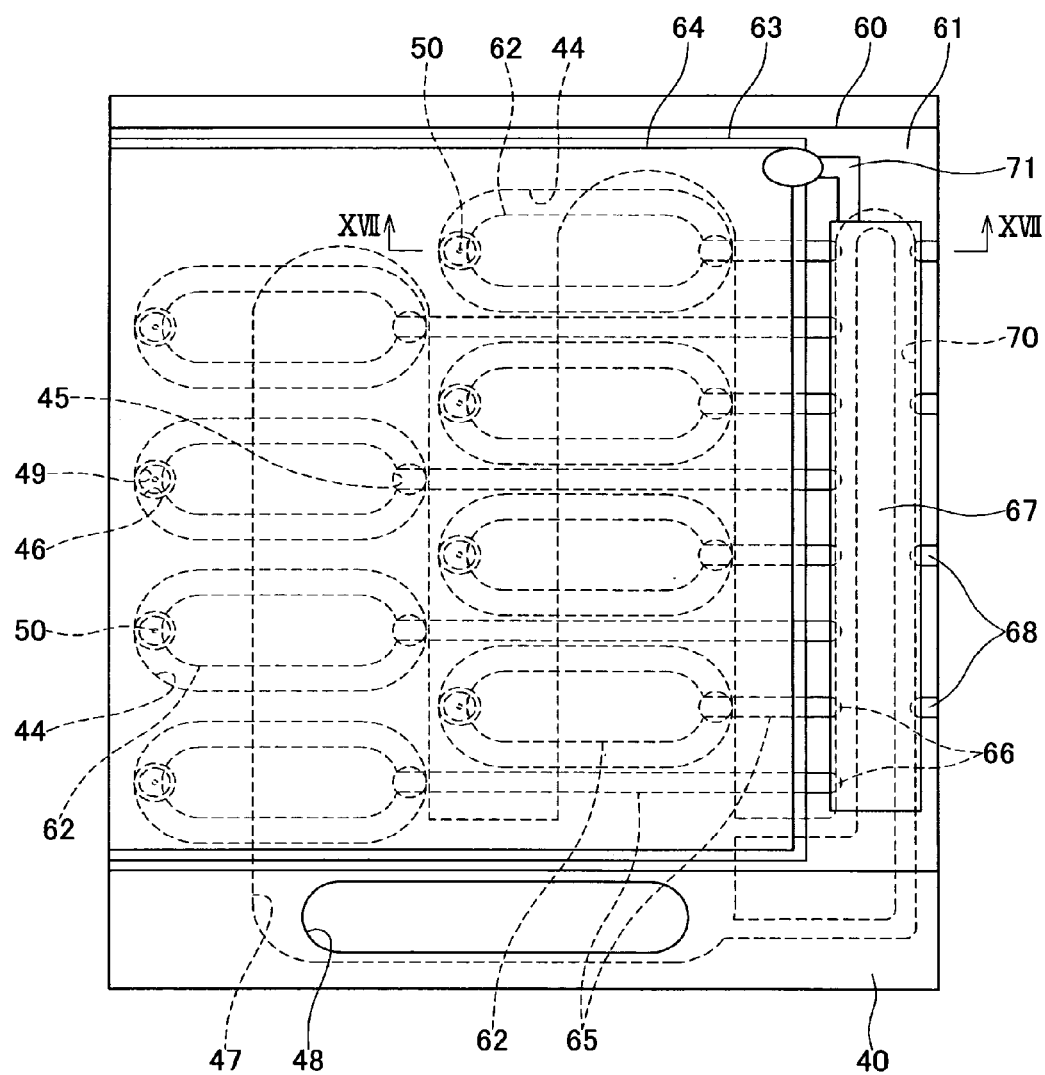
FIG. 16 is a top view of a portion enclosed with an alternate long and short dash line in FIG. 15.
Figure 17:
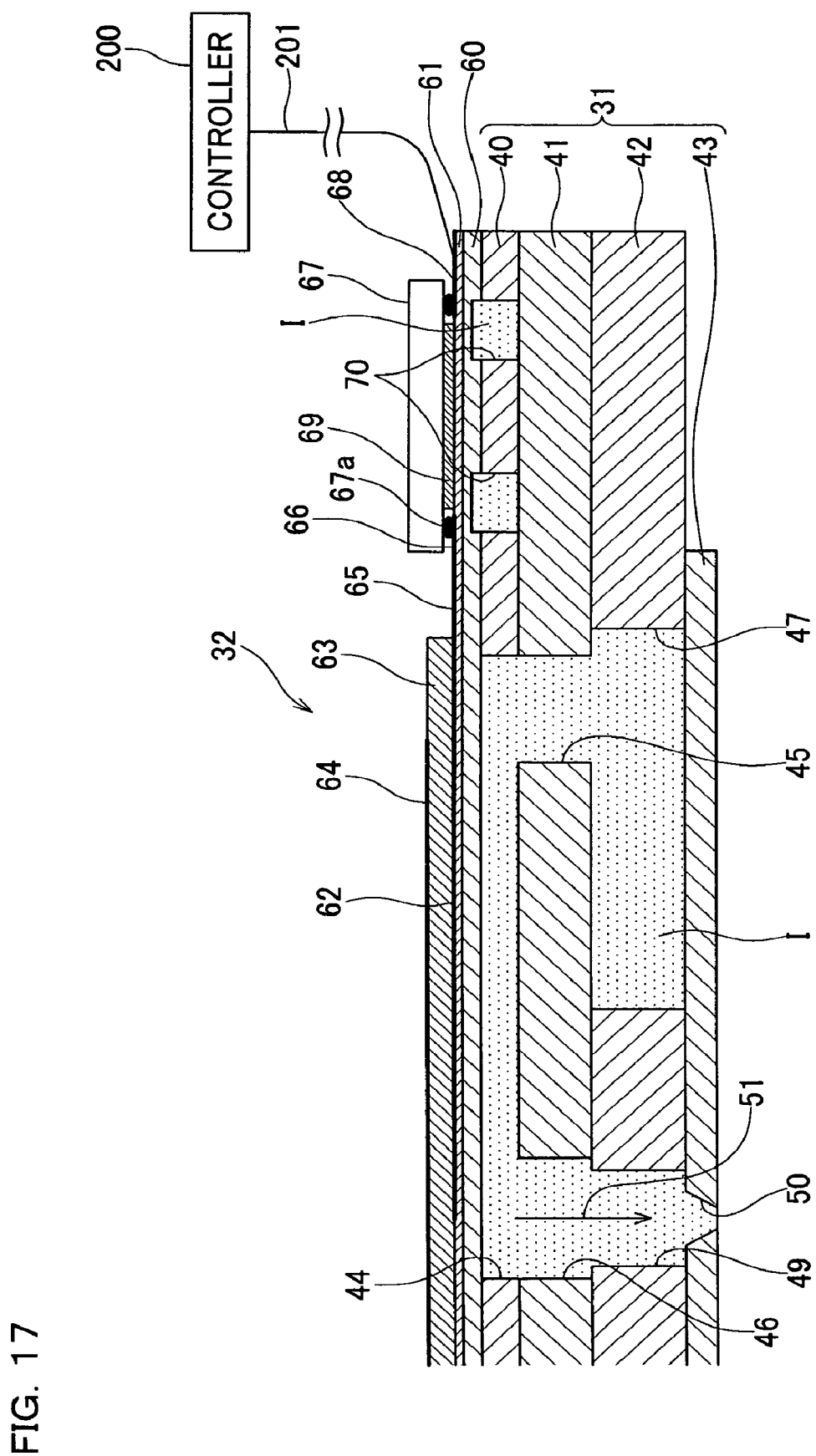
FIG. 17 is a sectional view taken along a line VII-VII of FIG. 6.

Next, a second embodiment of the present invention will be described. The second embodiment applies the present invention to, as an example, an ink-jet head. As illustrated in FIGS. 15 to 17, an ink-jet head 30 of this embodiment includes a passage unit 31 and an actuator unit 32. In the passage unit 32, individual ink passages 51 are formed. The actuator unit 32 is put on a surface of the passage unit 31.

The passage unit 31 includes a cavity plate 40, a base plate 41, a manifold plate 42, and a nozzle plate 43 which are put in layered and bonded to one another. The cavity plate 40, the base plate 41, and the manifold plate 42 are made of stainless steel. The nozzle plate 43 is made of a polymeric synthetic resin such as polyimide, etc. The nozzle plate 43 may be, similarly to the other plates 40 to 42, made of a metallic material such as stainless steel Many pressure chambers 44 are formed through the cavity plate 40. The pressure chambers 44 open in the surface of the passage unit 31 which means an upper side of the cavity plate 40 to which a diaphragm 60 is bonded as will be described later. The pressure chambers 44, only eight of which are shown in FIG. 16, are arranged in a zigzag pattern along a plane. Each pressure chamber 44 has, in a plan view, a substantially elliptic shape with its longer axis being along a longitudinal direction of the cavity plate 40.

In the base plate 41, communication holes 45 and 46 are formed such that they may overlap both lengthwise ends of each pressure chamber 44 in a plan view. In the manifold plate 42, a manifold channel 47 extending along a widthwise direction of the plate 42 (i.e., vertical direction in FIG. 16) is formed. In a plan view, the manifold channel 47 overlaps substantially a right half of each pressure chamber 44 in FIG. 16. The manifold channel 47 is supplied with ink I from an ink tank (not illustrated) through an ink supply port 48 formed in the cavity plate 40. In the manifold plate 42, further, communication holes 49 are formed such that they may overlap the respective communication holes 46 in a plan view. In the nozzle plate 43, nozzle ports 50 are formed such that, in a plan view, each of them may overlap a left end of each pressure chamber 44, that is, each of them may overlap the communication holes 46 and 49 in each pair.

As illustrated in FIG. 17, the manifold channel 47 communicates through the communication hole 45 with the pressure chamber 44, and further the pressure chamber 44 communicates through the communication holes 46 and 49 to the nozzle port 50. Thus, an individual ink passage 51 which extends from the manifold channel 47 through each pressure chamber 44 to a nozzle port 50 is formed within the passage unit 31.

As illustrated in FIGS. 16 and 17, the actuator unit 32 includes a diaphragm 60, an insulator 61, individual electrodes 62, a piezoelectric layer 63, and a common electrode 64. The diaphragm 60 is disposed on a surface of the passage unit 31. The insulator 61 is formed on a surface of the diaphragm 60. The individual electrodes 62 are formed on a surface of the insulator 61 to correspond to the respective pressure chambers 44. The piezoelectric layer 63 is formed on a surface of the individual electrode 62 to extend over many individual electrodes 62. The common electrode 64 is formed on a surface of the piezoelectric layer 63 to extend over the many individual electrodes 62. The diaphragm 60 is a plate made of a stainless steel and has a substantially rectangular shape in a plan view. The diaphragm 60 is bonded to an upper side of the cavity plate 40 so as to close openings of many pressure chambers 44. The insulator 61 is made of a ceramic material having a high thermal conductivity such as alumina, zirconia, silicon nitride, etc. The diaphragm 63 is a solid solution of lead titanate and lead zirconate, and its base is a lead zirconate titanate (PZT) having ferroelectricity.

Each individual electrode 62 is made of a conductive material such as gold, and has an elliptic shape slightly smaller than the pressure chamber 44 in a plan view. As illustrated in FIG. 16, in a plan view, the individual electrode 62 overlaps a middle part of a corresponding pressure chamber 44. Neighboring individual electrodes 62 are electrically insulated from each other by the insulator 61.

On the surface of the piezoelectric layer 61, a wiring portion 65 extends from one end of each individual electrode 62 (a right end in FIG. 16) in a direction along a longer axis of the individual electrode 32. The respective wiring portions 65 have, at their end portions, terminals 66 all having the same level. The terminal 66 is connected to a terminal 67a of a driver IC 67.

The driver IC 67, which selectively supplies a drive voltage to a corresponding individual electrode 62, is mounted on an upper side of the insulator 61 with the terminal 67a interposed therebetween. As illustrated in FIG. 17, a highly heat-conductive material 69 such as a metallic paste, a metallic film, etc. is interposed between the driver IC 67 and the insulator 61.

The driver IC 67 is connected to a controller 200 of the ink-jet printer 30 via a connection terminal 68 and a flexible wiring member 201 such as a flexible printed circuit board. The connection terminal 68 is formed on the upper side of the insulator 61. The wiring member 201 is connected to the connection terminal 68. The controller 200 generates predetermined data and sends the data to the driver IC 67 which then generates a drive pulse signal based on the data received from the controller 200 and sends the signal to the individual electrode 62 of the actuator unit 32.

The common electrode 64 is, similarly to the individual electrode 62, made of a conductive material such as gold. As illustrated in FIG. 16, the common electrode 64 is connected to the driver IC 67 via a single wiring portion 71. The common electrode 64 is, via the wiring portion 71 and the driver IC 67, grounded and thus kept at the ground potential.

Next, a description will be given to an operation of the actuator unit 32 during an ink ejection. When a driver IC 67 selectively supplies a drive voltage to an individual electrode 62, a potential of that individual electrode 62 which is disposed on the upper side of the piezoelectric layer 63 is differentiated from a potential of the common electrode 64 which is disposed on the lower side of the piezoelectric layer 63 and kept at the ground potential. This causes a vertical electric field at a portion of the piezoelectric layer 63 sandwiched between the electrodes 62 and 64. Consequently, a portion of the piezoelectric layer 63 right above the individual electrode 62 supplied with the drive voltage contracts in the horizontal direction which is perpendicular to the polarization occurring in the vertical direction. At this time, the portion of the piezoelectric layer 63 sandwiched between the electrodes 62 and 64 is deformed into a convex toward the pressure chamber 44, because the insulator 61 and the diaphragm 60 disposed under the piezoelectric layer 63 are fixed to the cavity plate 40. In association of this deformation of the piezoelectric layer 63, a portion of the diaphragm 60 covering the pressure chamber 44 is also deformed into a convex toward the pressure chamber 44. The volume of the pressure chamber 44 is thereby reduced to put pressure onto ink contained in the pressure chamber 44, so that the ink I is ejected from the nozzle 50 which communicates with the aforesaid pressure chamber 44.

Referring to FIGS. 16 and 17, an ink passage 70 is formed in the diaphragm 60 and the cavity plate 40 laminated with each other such that the ink passage 70 may locate under the driver IC 67, in other words, the ink passage 70 may locate at a position corresponding to the driver IC 67 with respect to a direction perpendicular to planes of the plates 40 to 43. The ink passage 70 communicates with the manifold channel 47, and provided between the manifold channel 47 and a region under the driver IC 67. The ink passage 70 is constituted by a recess opening in a lower side of the diaphragm 60 and a through hole formed through a thickness of the cavity plate 40. The recess and the through hole may be formed by means of a half-etching process and a full-etching process, respectively. When the ink I is introduced from the manifold channel 47 into the pressure chamber 44 for ejection of the ink I from the nozzle 50, the ink I within the ink passage 70 flows into the manifold channel 47.

Flow (quantity, speed, etc.) of the ink I within the ink passage 70 depends on drive of the actuator unit 32, and a radiation capability of the ink passage 70 depends on the flow of the ink I within the ink passage 70. In this embodiment, accordingly, the controller 200 controls, via the driver IC 67, the drive of the actuator unit 32 such that a radiation capability of the ink passage 70 may exceed both of a radiation capability of the insulator 61 and a radiation capability of the diaphragm 60. This enables heat generated by the driver IC 67 to be efficiently radiated by means of the ink passage 70.

In the above-described ink-jet head 30 of the second embodiment, the diaphragm 60 made of a metal having a high thermal conductivity is provided thereon with the insulator 61 made of a ceramic material having a high thermal conductivity, too. The driver IC 67 is mounted on a side of the insulator 61 opposite to a side thereof facing the diaphragm 60. Most of heat generated by the driver IC 67 is transmitted via the insulator 61 to the diaphragm 60, and further transmitted through the metallic cavity plate 40 to the ink I within the ink passage 70. The ink I which has received the heat flows within the ink passage 70 while transporting the heat away from the driver IC 67 and thus radiating the heat. As a consequence, the heat generated by the driver IC 67 can efficiently be radiated, so that excessive rise in temperature of the driver IC 67.

When the ink passage 70 does not communicate with the individual ink passage 51 formed within the passage unit 31, an additional system is required in order to control flow of the ink I within the ink passage 70. In the above-described embodiment, however, the ink passage 70 and the individual ink passage 51 formed within the passage unit 31 communicate with each other, and therefore the controller 200, which is basically intended for controlling the driver IC 67, can serve to control the flow of the ink I within the ink passage 70, too. A structure of the device can be simplified accordingly. However, it is not always necessary that the ink passage 70 communicates with the individual ink passage 51.

Liquid which flows within the passage 70 is not limited to the ink I, but may be other kinds of liquid such as water. However, when the ink I which is basically used in the ink-jet head 30 is used for radiating the heat of the driver IC 67 as in the second embodiment, the structure of the device can be simplified as compared with adoption of another liquid different from the ink.

The ink-jet head 30 of the second embodiment may further include a radiation plate (e.g., the radiation plate 9 of the first embodiment illustrated in FIGS. 6 and 7) for radiating heat transmitted to the ink I.

The flow of the ink I within the ink passage 70 is controlled by the controller 200 in order that the radiation capability of the ink passage 70 may be not less than a predetermined value. However, this is not limiting, and the flow of the ink I within the ink passage 70 may not be controlled.

In the second embodiment, the present invention is applied to an ink-jet head as an example. However, the present invention is also applicable to a liquid ejection head which ejects liquid other than ink. Further, the present invention is applicable to, in addition to the liquid ejection head, various devices including a substrate mounted thereon with an electronic element such as an IC.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

TABLE 1

| MATERIAL | THERMAL CONDUCTIVITY (W/mK) |
| --- | --- |
| (METALLIC MATERIAL) | |
| STAINLESS STEEL | 20 |
| IRON | 84 |
| COPPER | 403 |
| NICKEL | 94 |
| ALUMINIUM | 240 |
| (CERAMIC MATERIAL) | |
| ALUMINA | 20 to 34 |
| ALUMINIUM NITRIDE | 170 |
| SILICON CARBIDE | 75 |
| SILICON NITRIDE | 16 to 21 |
| MULLITE | 6 |
| ZIRCONIA | 2 to 4 |
| EPOXY RESIN | 0.19 |

What is claimed is:

1. A substrate mounted with an electronic element thereon, the substrate comprising:
    a base made of a metal;
    an insulator made of a ceramic material and provided on one face of the base, the insulator having a heat-generating electronic element mounted on its side facing contrary to the one face;
    a fluid passage that is formed within the base to have liquid flow therethrough, and radiates heat which has been transmitted from the electronic element via the insulator to the base; and
    a pressurizer that applies pressure to the liquid within the fluid passage,
    wherein the pressurizer includes:
    a pressurizing chamber that is formed within the fluid passage; and
    an actuator unit that changes a volume of the pressurizing chamber by displacing a portion of the insulator corresponding to the pressurizing chamber with respect to a direction perpendicular to the one face.

2. The substrate according to claim 1, wherein the fluid passage is a closed loop, an inner face of which is defined by both of the base and the insulator or by the base.

3. The substrate according to claim 1, wherein a wiring that is connected to a terminal of the electronic element is provided on the side of the insulator on which the electronic element is mounted.

4. The substrate according to claim 1, wherein the fluid passage is formed in such a manner that liquid within the fluid passage goes through a region corresponding to the electronic element with respect to the direction perpendicular to the one face and in addition is in contact with a part of a face of the insulator facing the one face, the part corresponding to the electronic element with respect to the direction perpendicular to the one face.

5. The substrate according to claim 1, wherein at least a part of a face defining the fluid passage is uneven.

6. The substrate according to claim 5, wherein:
    the base includes a plurality of plates which are put in layers in their thickness direction; and
    the fluid passage includes a through hole which is formed through a thickness of at least one of the plurality of plates and a plurality of recesses which are formed in a plate neighboring the plate through which the through hole is formed so as to correspond to the through hole.

7. The substrate according to claim 5, wherein a part of the face defining the fluid passage near to the electronic element is uneven.

8. The substrate according to claim 1, further comprising a controller that controls pressure application by the pressurizer to the liquid within the fluid passage.

9. The substrate according to claim 8, wherein the piezoelectric actuator is connected to the controller, and has a first electrode, a piezoelectric layer, and a second electrode, the first electrode being formed on the side of the insulator on which the electronic element is mounted so as to correspond to the pressurizing chamber with respect to a direction perpendicular to the first side, the piezoelectric layer being formed on a side of the first electrode opposite to a side thereof facing the insulator, the second electrode being formed on a side of the piezoelectric layer opposite to a side thereof facing the first electrode.

10. The substrate according to claim 1, further comprising, within the fluid passage, a flow regulator that forms a region in which a resistance to flow along one direction is higher than a resistance to flow along a direction opposite to the one direction.

11. A substrate mounted with an electronic element thereon, the substrate comprising:
   a base made of a metal;
   an insulator made of a ceramic material and provided on one face of the base, the insulator having a heat-generating electronic element mounted on its side facing contrary to the one face; and
   a radiator that radiates heat which has been transmitted from the electronic element via the insulator to the base, the radiator includes:
   a fluid passage that is formed within the base to have liquid flow therethrough; and
   a member having a plurality of protrusions, which is disposed on the side of the insulator on which the electronic element is mounted, at a portion corresponding to the fluid passage with respect to a direction perpendicular to the one face.

12. The substrate according to claim 11, wherein the fluid passage is a closed loop, an inner face of which is defined by both of the base and the insulator or by the base.

13. The substrate according to claim 11, wherein a wiring that is connected to a terminal of the electronic element is provided on the side of the insulator on which the electronic element is mounted.

14. The substrate according to claim 11, wherein the fluid passage is formed in such a manner that liquid within the fluid passage goes through a region corresponding to the electronic element with respect to the direction perpendicular to the one face and in addition is in contact with a part of a face of the insulator facing the one face, the part corresponding to the electronic element with respect to the direction perpendicular to the one face.

15. The substrate according to claim 11, wherein at least a part of a face defining the fluid passage is uneven.

16. The substrate according to claim 15, wherein:
   the base includes a plurality of plates which are put in layers in their thickness direction; and
   the fluid passage includes a through hole which is formed through a thickness of at least one of the plurality of plates and a plurality of recesses which are formed in a plate neighboring the plate through which the through hole is formed so as to correspond to the through hole.

17. The substrate according to claim 15, wherein a part of the face defining the fluid passage near to the electronic element is uneven.

18. The substrate according to claim 11, wherein the liquid within the fluid passage is in contact with a part of the side of the insulator facing the first side of the base, the part corresponding to the member with respect to the direction perpendicular to the first side.

19. The substrate according to claim 11, wherein a part of a face defining the fluid passage near to the member is uneven.

* * * * *